US012453224B2

(12) United States Patent
Zeng et al.

(10) Patent No.: US 12,453,224 B2
(45) Date of Patent: Oct. 21, 2025

(54) LED DISPLAY SUBSTRATE AND METHOD FOR MANUFACTURING THE SAME, DISPLAY PANEL

(71) Applicants: Hefei Xinsheng Optoelectronics Technology Co., Ltd., Anhui (CN); BOE TECHNOLOGY GROUP CO., LTD., Beijing (CN)

(72) Inventors: Ting Zeng, Beijing (CN); Xinhong Lu, Beijing (CN); Heren Gui, Beijing (CN); Jian Yang, Beijing (CN); Yongfei Li, Beijing (CN)

(73) Assignees: Hefei Xinsheng Optoelectronics Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 534 days.

(21) Appl. No.: 17/775,959

(22) PCT Filed: May 20, 2021

(86) PCT No.: PCT/CN2021/094849
§ 371 (c)(1),
(2) Date: May 11, 2022

(87) PCT Pub. No.: WO2022/001462
PCT Pub. Date: Jan. 6, 2022

(65) Prior Publication Data
US 2022/0393087 A1    Dec. 8, 2022

(30) Foreign Application Priority Data
Jun. 30, 2020  (CN) .......................... 202010621459.9

(51) Int. Cl.
H10H 20/857    (2025.01)
H10H 20/01     (2025.01)
H10H 20/84     (2025.01)

(52) U.S. Cl.
CPC .......... H10H 20/857 (2025.01); H10H 20/01 (2025.01); H10H 20/84 (2025.01); *H10H 20/034* (2025.01); *H10H 20/0364* (2025.01)

(58) Field of Classification Search
CPC ... H01L 33/44; H01L 25/167; H10K 59/8792; H10K 59/131
See application file for complete search history.

(56) References Cited

U.S. PATENT DOCUMENTS 10,527,897 B2    1/2020   Ishigaki et al.
2003/0193054 A1* 10/2003  Hayakawa ........ H01L 29/78621
                                                    438/149
(Continued)

FOREIGN PATENT DOCUMENTS

CN    105655366 A    6/2016
CN    110098236 A    8/2019
(Continued)

*Primary Examiner* — Evren Seven
(74) *Attorney, Agent, or Firm* — HOUTTEMAN LAW LLC

(57) ABSTRACT

The present disclosure provides a display substrate, including: a base substrate including a display area and a bonding area; a first metal conductive layer pattern on the base substrate; a first passivation layer on the first metal conductive layer pattern; a second metal conductive layer pattern on the first passivation layer; a second passivation layer on the second metal conductive layer pattern; a first blackening layer pattern is disposed between the first metal conductive layer pattern and the first passivation layer, an orthographic projection of which on the base substrate is located in that of the first metal conductive layer pattern on the base substrate; and/or a second blackening layer pattern is dis- (Continued)

posed between the second metal conductive layer pattern and the second passivation layer, an orthographic projection of which on the base substrate is located in that of the second metal conductive layer pattern on the base substrate.

18 Claims, 8 Drawing Sheets

(56) References Cited

U.S. PATENT DOCUMENTS

| | | | |
|---|---|---|---|
| 2005/0077814 A1* | 4/2005 | Koo | H10K 59/80522 313/500 |
| 2008/0309235 A1* | 12/2008 | Yamazaki | H10K 59/126 313/512 |
| 2009/0184324 A1* | 7/2009 | Oh | H10K 59/131 257/E33.053 |
| 2013/0099218 A1* | 4/2013 | Lee | H10K 50/824 438/22 |
| 2014/0312323 A1* | 10/2014 | Park | H10K 59/80522 438/23 |
| 2016/0013436 A1* | 1/2016 | Im | H10K 50/805 257/40 |
| 2016/0049615 A1* | 2/2016 | Kim | H10K 50/865 257/40 |
| 2016/0334682 A1* | 11/2016 | Zhang | H01L 27/1225 |
| 2019/0067405 A1* | 2/2019 | Wang | H10K 59/8792 |
| 2021/0020698 A1* | 1/2021 | Xianyu | H10K 59/40 |
| 2021/0043870 A1* | 2/2021 | Baek | G02F 1/13338 |

FOREIGN PATENT DOCUMENTS

| | | |
|---|---|---|
| CN | 111078059 A | 4/2020 |
| CN | 111863857 A | 10/2020 |

* cited by examiner

LED DISPLAY SUBSTRATE AND METHOD FOR MANUFACTURING THE SAME, DISPLAY PANEL

TECHNICAL FIELD

The present application relates to the field of display technology, and in particular, to a light emitting diode (LED) display substrate and a method for manufacturing a light emitting diode (LED) display substrate, and a display panel.

BACKGROUND

As a new generation of display technology, Micro/Mini light emitting diode (Micro/Mini-LED) display technology has the advantages of high brightness, high light emitting efficiency, low power consumption, and the like. Generally, Micro/Mini-LED chips are transferred to a display substrate by a transfer technology, and due to the limitation of the transfer technology, it is impossible to directly manufacture a large-sized LED display substrate, therefore, in the related art, the large-sized LED display substrate is formed by splicing a plurality of small-sized LED display substrates in a splicing manner.

At present, signal wires in the LED display substrate are made of a metal material (e.g., copper) and run through a display area, since the metal material has high light reflectivity, the signal wires are obviously visible in the display area, thus display quality of the LED display substrate is affected.

SUMMARY

The present disclosure aims to solve at least one of technical problems in the related art, and provides an LED display substrate and a method for manufacturing an LED display substrate.

In a first aspect, an embodiment of the present disclosure provides an LED display substrate, including:
a base substrate including a display area and a bonding area;
a first metal conductive layer pattern located on the base substrate and including a plurality of signal wires;
a first passivation layer located on a side of the first metal conductive layer pattern away from the base substrate;
a second metal conductive layer pattern located on a side of the first passivation layer away from the base substrate and including a first connection terminal in the display area and a second connection terminal in the bonding area, with the first connection terminal and the second connection terminal being respectively connected with a corresponding signal wire pattern through a via hole;
a second passivation layer located on a side of the second metal conductive layer pattern away from the base substrate; where
a first blackening layer pattern is provided between the first metal conductive layer pattern and the first passivation layer, and an orthographic projection of the first blackening layer pattern on the base substrate is located in an area where an orthographic projection of the first metal conductive layer pattern on the base substrate is located;
and/or a second blackening layer pattern is provided between the second metal conductive layer pattern and the second passivation layer, and an orthographic projection of the second blackening layer pattern on the base substrate is located in an area where an orthographic projection of the second metal conductive layer pattern on the base substrate is located.

In some implementations, the orthographic projection of the first blackening layer pattern on the base substrate and the orthographic projection of the first metal conductive layer pattern on the base substrate completely coincide.

In some implementations, the first connection terminal includes a first actual connection region, and
the orthographic projection of the second blackening layer pattern on the base substrate and an orthographic projection of a portion of the second metal conductive layer pattern except the first actual connection region on the base substrate completely coincide.

In some implementations, a protective pattern is provided on a side of the second connection terminal away from the base substrate and at side surfaces of the second connection terminal, and a material of the protective pattern includes a metal oxide conductive material;
a portion of the second blackening layer pattern covering the second connection terminal is located between the protective pattern and the second connection terminal.

In some implementations, a material of the first blackening layer pattern includes at least one of metal oxide, metal nitride or metal oxynitride; and
a material of the second blackening layer pattern includes at least one of metal oxide, metal nitride or metal oxynitride.

In some implementations, the material of the first blackening layer pattern includes at least one of molybdenum oxide, molybdenum nitride, molybdenum oxynitride, molybdenum niobium oxide, molybdenum niobium nitride or molybdenum niobium oxynitride; and
the material of the second blackening layer pattern includes at least one of molybdenum oxide, molybdenum nitride, molybdenum oxynitride, molybdenum niobium oxide, molybdenum niobium nitride or molybdenum niobium oxynitride.

In some implementations, the material of the first passivation layer includes at least one of silicon oxide, silicon nitride or silicon oxynitride; and the material of the second passivation layer includes at least one of silicon oxide, silicon nitride, or silicon oxynitride.

In some implementations, the material of the first passivation layer includes silicon oxynitride, and a thickness of the first passivation layer ranges from 230 nm to 250 nm; and
the material of the second passivation layer includes silicon oxynitride, and a thickness of the second passivation layer ranges from 230 nm to 250 nm.

In some implementations, a first functional pattern in contact with the first metal conductive layer pattern is provided on a side of the first metal conductive layer pattern close to the base substrate, and the first functional pattern is configured to improve bonding firmness between the first metal conductive layer pattern and the base substrate; and/or a second functional pattern in contact with the second metal conductive layer pattern is provided on a side of the second metal conductive layer pattern close to the base substrate, and the second functional pattern is configured to improve bonding firmness between the second metal conductive layer pattern and a film layer located on the side of the second metal conductive layer pattern close to the base substrate.

In some implementations, a material of the first functional pattern includes molybdenum or a molybdenum niobium alloy; and a material of the second functional pattern includes molybdenum or a molybdenum niobium alloy.

In some implementations, a first planarization layer is disposed between the first passivation layer and the second metal conductive layer pattern;

and/or a second planarization layer is disposed on a side of the second passivation layer away from the base substrate.

In a second aspect, an embodiment of the present disclosure provides a display panel, including the LED display substrate provided in the first aspect above.

In a third aspect, an embodiment of the present disclosure provides a method for manufacturing the LED display substrate in the first aspect, including:

providing a base substrate, where the base substrate includes a display area and a bonding area;

forming a first metal conductive layer pattern on a side of the base substrate, where the first metal conductive layer pattern includes a plurality of signal wires;

forming a first passivation layer on a side of the first metal conductive layer pattern away from the base substrate;

forming a second metal conductive layer pattern on a side of the first passivation layer away from the base substrate, where the second metal conductive layer pattern includes a first connection terminal located in the display area and a second connection terminal located in the bonding area, and the first connection terminal and the second connection terminal are respectively connected with corresponding signal wire patterns through via holes;

forming a second passivation layer on a side of the second metal conductive layer pattern away from the base substrate;

where, the method further includes: before forming the first passivation layer, forming a first blackening layer pattern on the side of the first metal conductive layer pattern away from the base substrate, where an orthographic projection of the first blackening layer pattern on the base substrate is located in an area where an orthographic projection of the first metal conductive layer pattern on the base substrate is located;

and/or, the method further includes: before forming the second passivation layer, forming a second blackening layer pattern on the side of the second metal conductive layer pattern away from the base substrate, where an orthographic projection of the second blackening layer pattern on the base substrate is located in an area where an orthographic projection of the second metal conductive layer pattern on the base substrate is located.

In some implementations, the forming a second metal conductive layer pattern and the forming a second blackening layer pattern include:

forming a third metal material film on the side of the first passivation layer away from the base substrate;

forming a second blackening material film on a side of the third metal material film away from the base substrate;

performing a patterning process on the third metal material film and the second blackening material film by using a second mask plate to obtain the second metal conductive layer pattern and the second blackening layer pattern;

the first connection terminal includes a first actual connection region, where a first connection via hole is formed in the first passivation layer at a position directly opposite to the first actual connection region;

the method further includes: after forming the first passivation layer, removing a portion of the second blackening layer pattern in the first connection via hole.

In some implementations, the method further includes: after removing the portion of the second blackening layer pattern in the first connection via hole, electrically connecting an LED with the first connection terminal; and electrically connecting a flexible circuit board with the second connection terminal.

DRAWINGS

DETAILED DESCRIPTION

In order to make those skilled in the art better understand the technical solutions of the present disclosure, an LED display substrate and a method for manufacturing an LED display substrate provided by the present disclosure are described in detail below in combination with the accompanying drawings.

Figure 1:
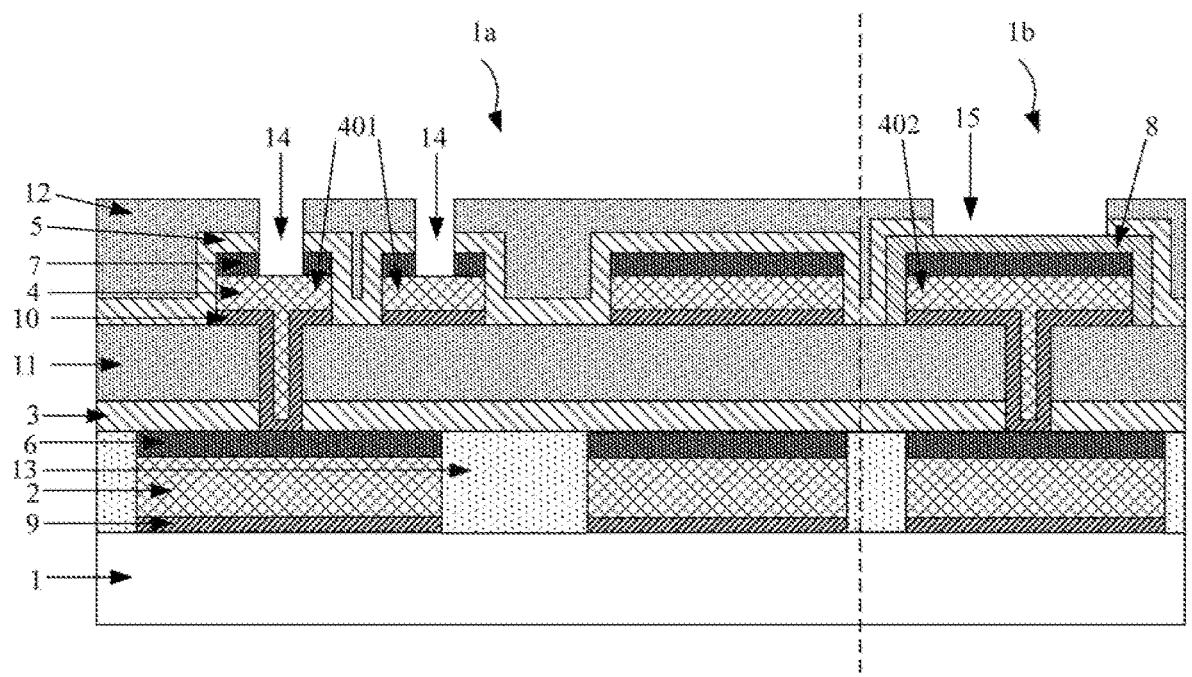
FIG. 1 is a schematic structural diagram of an LED display substrate according to an embodiment of the present disclosure.

FIG. 1 is a schematic structural diagram of an LED display substrate according to an embodiment of the present disclosure, and as shown in FIG. 1, the LED display substrate includes: a base substrate 1, a first metal conductive layer pattern 2, a first passivation layer 3, a second metal conductive layer pattern 4 and a second passivation layer 5.

The base substrate 1 includes a display area 1a and a bonding area 1b; the first metal conductive layer pattern 2 is located on the base substrate 1, and the first metal conductive layer pattern 2 includes a plurality of signal wires; the first passivation layer 3 is located on a side of the first metal conductive layer pattern 2 away from the base substrate 1, and the first passivation layer 3 is provided therein with via holes communicated with part of the signal wires; the second metal conductive layer pattern 4 is located on a side of the first passivation layer 3 away from the base substrate 1, and the second metal conductive layer pattern 4 includes first connection terminals 401 (also called pads) located in the display area 1a and second connection terminals 402 located in the bonding area 1b, where the first connection terminals 401 and the second connection terminals 402 are respectively connected to corresponding signal wires through the via holes in the first passivation layer 3, each first connection terminal 401 has a first actual connection region, and each second connection terminal 402 has a second actual connection region; the second passivation layer 5 is located on a side of the second metal conductive layer pattern 4 away from the base substrate 1, and the second passivation layer 5 is provided with first connection via holes 14 communicated to first actual connection regions of the first connection terminals 401 and second connection via holes 15 communicated to second actual connection regions of the second connection terminals 402.

In practice, pins of an LED chip may be electrically connected to the first connection terminals 401 through the first connection via holes 14 in the second passivation layer 5 by a die bonding process; connection pins of a flexible printed circuit (FPC for short) may be bonded to the second connection terminals 402 through the second connection via holes 15 in the second passivation layer 5 by a bonding process. The die bonding process for the LED chip and the bonding process for the FPC may be performed in any existing manner in the art, and will not be described in detail here.

In order to reduce the influence of at least one of the first metal conductive layer pattern 2 and the second metal conductive layer pattern 4 on the display effect, in the LED display substrate provided in the embodiment of the present disclosure, a first blackening layer pattern 6 is disposed between the first metal conductive layer pattern 2 and the first passivation layer 3, and an orthographic projection of the first blackening layer pattern 6 on the base substrate 1 is located in an area where an orthographic projection of the first metal conductive layer pattern 2 on the base substrate 1 is located; and/or a second blackening layer pattern 7 is disposed between the second metal conductive layer pattern 4 and the second passivation layer 5, and an orthographic projection of the second blackening layer pattern 7 on the base substrate 1 is located in an area where an orthographic projection of the second metal conductive layer pattern 4 on the base substrate 1 is located.

In the embodiment of the present disclosure, light absorption coefficients of the first blackening layer pattern 6 and the second blackening layer pattern 7 each range from 1.0 to 2.0, and the first blackening layer pattern 6 and the second blackening layer pattern 7 can absorb light and reduce reflection.

Specifically, when the first blackening layer pattern 6 is disposed between the first metal conductive layer pattern 2 and the first passivation layer 3, an overall reflectivity of the first metal conductive layer pattern 2 and a structure above the first metal conductive layer pattern 2 can be reduced, and the visibility of at least a partial region of the first metal conductive layer pattern 2 can be decreased; when the second blackening layer pattern 7 is disposed between the second metal conductive layer pattern 4 and the second passivation layer 5, an overall reflectivity of the second metal conductive layer pattern 4 and a structure above the second metal conductive layer pattern 4 can be reduced, and the visibility of at least a partial region of the second metal conductive layer pattern 4 can be decreased.

As can be seen from the above, according to the technical solution of the present disclosure, the first blackening layer pattern 6 and the second blackening layer pattern 7 are provided, so that the visibility of the first metal conductive layer pattern 2 and the second metal conductive layer pattern 4 can be decreased to a certain extent, which is beneficial to improving the display quality of the LED display substrate. FIG. 1 shows only an exemplary case where both the first blackening layer pattern 6 and the second blackening layer pattern 7 are provided.

In some implementations, a first planarization layer 11 is disposed between the first passivation layer 3 and the second metal conductive layer pattern 4. By disposing the first planarizing layer 11 between the first passivation layer 3 and the second metal conductive layer pattern 4, on one hand, the film formation quality during the process of manufacturing the second metal conductive layer pattern 4 can be improved, and on the other hand, a distance between the first metal conductive layer pattern 2 and the second metal conductive layer pattern 4 can be increased to reduce a parasitic capacitance between overlapping portions of the first metal conductive layer pattern 2 and the second metal conductive layer pattern 4.

In some implementations, an insulation layer 13 is disposed on the base substrate 1, and the insulation layer 13 is configured to define a formation region for the first metal conductive layer pattern 2, so that the first metal conductive layer pattern 2 having a certain thickness can be formed. In addition, the insulation layer is provided, so that a surface flatness of the base substrate formed with the first metal conductive layer pattern 2 (or the first blackening layer pattern 6) thereon can be improved to a certain extent, and a height difference of the first passivation layer 3 manufactured subsequently is reduced, and the film formation quality of the first passivation layer 3 is improved. For details, reference may be made to corresponding description of the step for manufacturing the insulation layer 13.

When designing a thickness of the first planarization layer 11, the planarization effect (related to thicknesses of the insulation layer 13, the first metal conductive layer pattern 2, and the first blackening layer pattern 6) should be considered, and the parasitic capacitance between the overlapping portions of the first metal conductive layer pattern 2 and the second metal conductive layer pattern 4 should not be too large, and an overall thickness of the LED display substrate should be ensured not to be too large. Based on consideration of the above factors, in some implementations, the thickness of the first planarization layer 11 ranges from about 1.5 μm to about 2.5 μm.

In some implementations, a second planarization layer 12 is disposed on a side of the second passivation layer 5 away from the base substrate 1. The second planarization layer 12 is disposed to provide a planarization surface, which is beneficial to the die bonding process for the LED chip and the bonding process for the FPC. In some implementations, the maximum thickness of the second planarization layer 12 is about 2.0 μm.

In some implementations, the orthographic projection of the first blackening layer pattern 6 on the base substrate 1 completely coincides with the orthographic projection of the first metal conductive layer pattern 2 on the base substrate. That is, the first blackening layer pattern 6 can exactly cover an area where the first metal conductive layer pattern 2 is located, so that the visibility of each portion of the first metal conductive layer pattern 2 can be effectively decreased.

In some implementations, the orthographic projection of the second blackening layer pattern 7 on the base substrate 1 completely coincides with the orthographic projection of portions of the second metal conductive layer pattern 4 except the first actual connection region on the base substrate 1; that is, the second blackening layer pattern 7 can exactly cover regions of the second metal conductive layer pattern 4 except the first actual connection region. On one hand, the first actual connection region of the first connection terminal 401 may be welded together with the LED chip, and due to the blocking of the LED chip, the portions of the first connection terminal 401 located in the first actual connection region must be invisible, so that no blackening layer pattern is desired to cover the first actual connection region; on the other hand, during the die bonding process, a better bonding firmness between solder paste and the first connection terminal 401 (made of a metal material) is desired.

In some implementations, a protective pattern 8 is disposed on a side of the second connection terminal 402 away from the base substrate 1 and at side surfaces of the second connection terminal 402, and a material of the protective pattern 8 is a metal oxide conductive material; a portion of the second blackening layer pattern covering the second connection terminal 402 is located between the conductive protective pattern and the second connection terminal 402. Since the die bonding process for the LED chip and the bonding process for the FPC are performed separately, and the die bonding process for the LED chip is performed first and then the bonding process for the FPC is performed, a relatively high temperature may be generated during the die bonding process for the LED chip, and particles having oxidation property (for example, oxygen) in an external environment and particles having oxidation property released by other film layers (for example, an organic film layer in the LED display substrate itself contains oxygen and may release oxygen in a relatively high temperature environment) may oxidize the metal material of the second connection terminal 402, thereby affecting the conductivity of the second connection terminal 402. In view of above, in the embodiment of the present disclosure, the protective pattern 8 is provided on the side of the second connection terminal 402 away from the base substrate 1 and at the side surfaces of the second connection terminal 402 to prevent the second connection terminal 402 from being oxidized.

In addition, since the second connection terminal 402 is to be electrically connected with the FPC in the following step, the protective pattern 8 is desired to have a certain conductivity in addition to protecting the second connection terminal 402 from being oxidized. In some implementations, the material of the protective pattern 8 includes a metal oxide material having a better conductivity, such as indium tin oxide, indium gallium zinc oxide, and the like.

In some implementations, a first functional pattern 9 in contact with the first metal conductive layer pattern 2 is provided on a side of the first metal conductive layer pattern 2 close to the substrate base 1, and the first functional pattern 9 is configured to improve the bonding firmness between the first metal conductive layer pattern 2 and the substrate base 1.

In some implementations, a second functional pattern 10 in contact with the second metal conductive layer pattern 4 is provided on a side of the second metal conductive layer pattern 4 close to the substrate base 1, and the second functional pattern 10 is configured to improve the bonding firmness between the second metal conductive layer pattern 4 and a film layer located on a side of the second metal conductive layer pattern 4 close to the substrate base 1.

In practical applications, taking the first metal conductive layer pattern 2 as an example, on one hand, if the base substrate 1 is a flexible substrate (made of an organic material), it will release particles having oxidation property under a relatively high temperature environment, thereby causing the metal material of the first metal conductive layer pattern 2 to be oxidized; on the other hand, the first metal conductive layer pattern 2 is generally made of a copper material, and the adhesion between the copper material and the base substrate 1 is poor. Similarly, the second metal conductive layer pattern 4 also faces the above-mentioned problems (generally, an organic material film layer, such as a planarization layer, may exist under the second metal conductive layer pattern 4).

In order to solve the above problems, in the solution according to the embodiment of the present disclosure, the first functional pattern 9 and the second functional pattern 10 are provided, so that the first metal conductive layer pattern 2 and the second metal conductive layer pattern 4 are prevented from being oxidized, and the bonding firmness between the first metal conductive layer pattern 2 and the organic material under the first metal conductive layer pattern 2, the bonding firmness between the second metal conductive layer pattern 4 and the organic material under the second metal conductive layer pattern 4 are improved.

In some implementations, a material of the first functional pattern 9 includes: molybdenum or molybdenum niobium alloy, and a material of the second functional pattern 10 includes molybdenum or molybdenum niobium alloy.

In some implementations, a material of the first blackening layer pattern 6 includes at least one of metal oxide, metal nitride or metal oxynitride, and a material of the second blackening layer pattern 7 includes at least one of metal oxide, metal nitride or metal oxynitride.

Further, the material of the first blackening layer pattern 6 includes at least one of molybdenum oxide, molybdenum nitride, molybdenum oxynitride, molybdenum niobium oxide, molybdenum niobium nitride or molybdenum niobium oxynitride, and the material of the second blackening layer pattern 7 includes at least one of molybdenum oxide, molybdenum nitride, molybdenum oxynitride, molybdenum niobium oxide, molybdenum niobium nitride or molybdenum niobium oxynitride.

In the embodiment of the present disclosure, the first blackening layer pattern 6 and the second blackening layer pattern 7 are desired to have not only a relatively high light absorption performance but also a certain conductive property. In general, it is desirable that an average value of a sheet resistance of each of the first blackening layer pattern 6 and the second blackening layer pattern 7 is less than 1000 Ω/□.

The following Table 1 shows some property indexes and manufacturing process parameters of molybdenum niobium oxide, molybdenum niobium oxynitride, molybdenum nitride, and molybdenum oxynitride, which may be used as materials of the first blackening layer pattern 6 and the second blackening layer pattern 7 in the embodiment of the present disclosure.

pattern 4 and the structure above the second metal conductive layer pattern sequentially includes: the second metal conductive layer pattern 4, the second blackening layer pattern 7, the second passivation layer 5, and the second planarization layer 12, which are in an order from bottom to top.

Figure 2A:
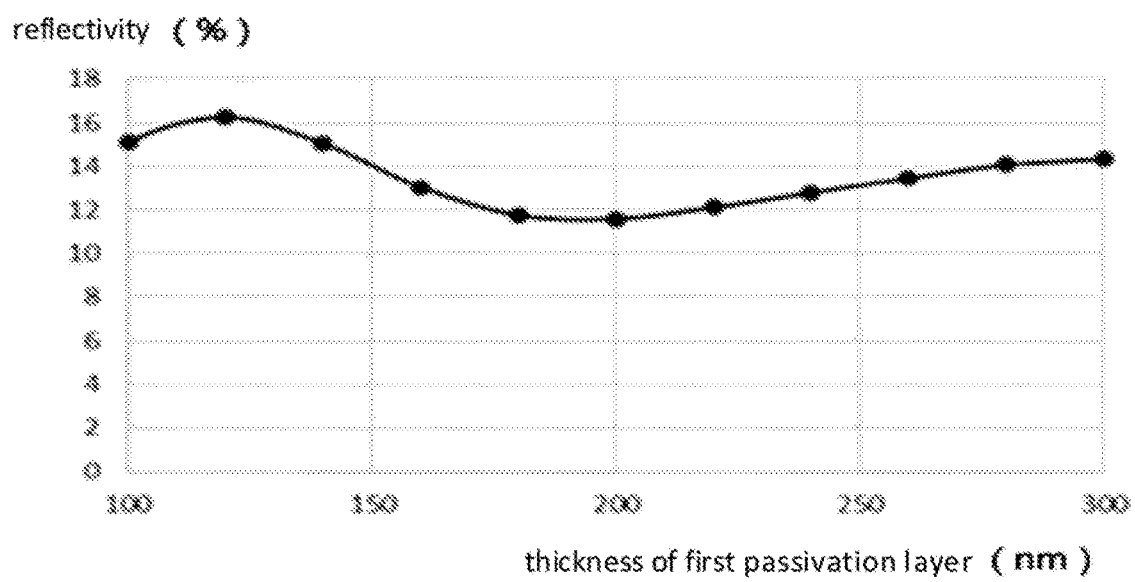
FIG. 2a is a graph showing a variation of an overall reflectivity of a first laminated structure with varying of a thickness of a first passivation layer when materials of the first passivation layer and a second passivation layer are both silicon nitride.

FIG. 2a is a graph showing a variation of an overall reflectivity of the first laminated structure with varying of the thickness of the first passivation layer 3 when the materials of the first passivation layer and the second

TABLE 1

| | | property index | | | | manufacturing process parameters | | | |
| --- | --- | --- | --- | --- | --- | --- | --- | --- | --- |
| | | sheet resistance (Ω/□) | | | | | flow rate of gas | | |
| material | thickness | Maximum value | Minimum value | Mean value | flatness | Power | nitrogen gas | argon gas | oxygen gas |
| molybdenum niobium oxide | 35 nm | 1185 | 754.1 | 995.7 | 22.22% | 28 KW | 0 | 200 sccm | / |
| molybdenum niobium oxynitride | | 773.4 | 529.5 | 634.43 | 18.72% | | 10 sccm | | / |
| molybdenum oxide | | 590 | 290 | 462 | 34.09% | | 0 | | 242 sccm |
| molybdenum | | 422 | 221 | 274 | 31.26% | | 10 sccm | | 225 sccm |
| oxynitride | | 593 | 240 | 461 | 42.37% | | | | 242 sccm |

In some implementations, both the first blackening layer pattern 6 and the second blackening layer pattern 7 are made of molybdenum oxide. As a metal oxide having a relatively high conductivity, the molybdenum dioxide has a relatively high carrier conduction rate, and a tunnel like gap in crystal structure of the molybdenum dioxide is also beneficial to quick embedding and releasing of charged particles. Moreover, molybdenum resources are relatively rich, the molybdenum oxide may be made by many ways in low cost, thus the molybdenum dioxide is suitable for mass production.

In the embodiment of the present disclosure, the first blackening layer pattern 6 is in direct contact with the first passivation layer 3, and a material of the first passivation layer 3 also affects the overall reflectivity of the first metal conductive layer pattern 2 and the structure thereabove; the second blackening layer pattern 7 is in direct contact with the second passivation layer 5, and a material of the second passivation layer 5 also affects the overall reflectivity of the second metal conductive layer pattern 4 and the structure thereabove.

In some implementations, the material of the first passivation layer 3 includes at least one of silicon oxide, silicon nitride or silicon oxynitride, and the material of the second passivation layer 5 includes at least one of silicon oxide, silicon nitride, or silicon oxynitride.

In the embodiment of the present disclosure, material selection and thickness design of the first passivation layer 3 and the second passivation layer 5 are analyzed by taking a case where the first metal conductive layer pattern 2 and the second metal conductive layer pattern 4 are made of copper as an example.

The laminated structure (referred to as a first laminated structure) formed by the first metal conductive layer pattern 2 and the structure above the first metal conductive layer pattern sequentially includes: the first metal conductive layer pattern 2, the first blackening layer pattern 6, the first passivation layer 3, the first planarization layer 11, the second passivation layer 5, and the second planarization layer 12, which are in an order from bottom to top.

The laminated structure (referred to as a second laminated structure) formed by the second metal conductive layer passivation layer are both silicon nitride, as shown in FIG. 2a, the thickness of the second passivation layer 5 is fixed at about 200 nm, when the thickness of the first passivation layer 3 is about 180 nm, the overall reflectivity of the first laminated structure reaches the minimum, which is about 11.7%.

Figure 2B:
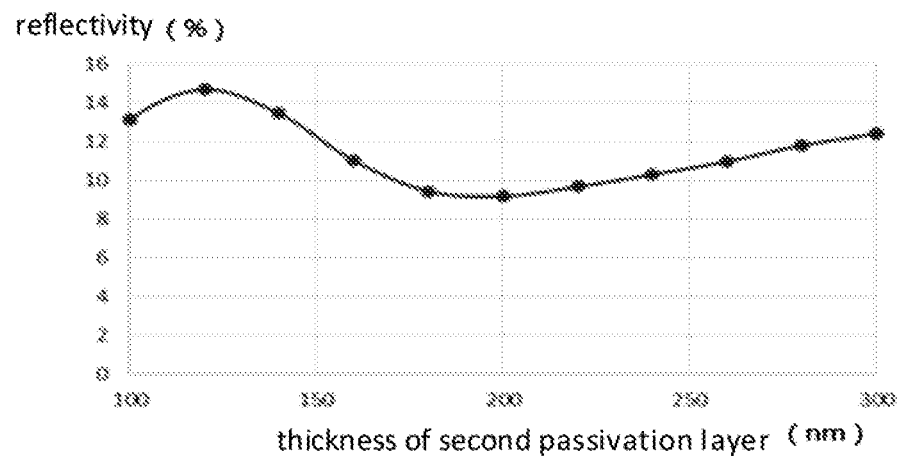
FIG. 2b is a graph showing a variation of an overall reflectivity of a second laminated structure with varying of a thickness of the second passivation layer when materials of a first passivation layer and the second passivation layer are both silicon nitride.

FIG. 2b is a graph showing a variation of the overall reflectivity of the second laminated structure with varying of the thickness of the second passivation layer when the materials of the first passivation layer and the second passivation layer are both silicon nitride, as shown in FIG. 2b, the thickness of the first passivation layer 3 is fixed at about 180 nm, when the thickness of the second passivation layer 5 is about 200 nm, the overall reflectivity of the second laminated structure reaches the minimum, which is about 9.2%.

When both the first passivation layer 3 and the second passivation layer 5 are made of silicon nitride, and the thickness of the first passivation layer 3 is about 180 nm and the thickness of the second passivation layer 5 is about 200 nm, the overall reflectivity of the first laminated structure and the overall reflectivity of the second laminated structure each can reach the minimum, but there is a certain difference between these minimum overall reflectivities (the difference is about 11.7%−9.2%=2.5%).

Figure 3A:
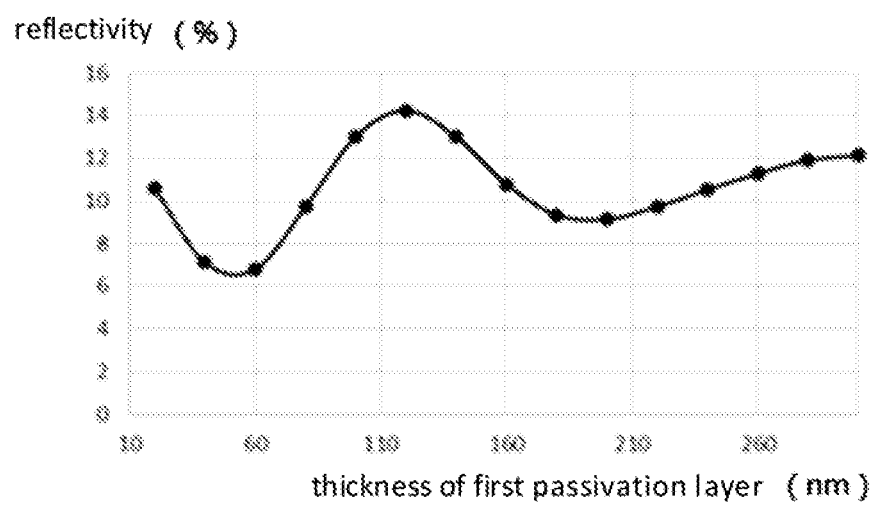
FIG. 3a is a graph showing a variation of an overall reflectivity of a first laminated structure with varying of a thickness of a first passivation layer when a material of the first passivation layer is silicon nitride and a material of a second passivation layer is silicon oxynitride.

FIG. 3a is a graph showing a variation of the overall reflectivity of the first laminated structure with varying of the thickness of the first passivation layer 3 when the first passivation layer is made of silicon nitride and the second passivation layer is made of silicon oxynitride, as shown in FIG. 3a, the thickness of the second passivation layer 5 is fixed at about 240 nm, when the thickness of the first passivation layer 3 is about 200 nm, the overall reflectivity of the first laminated structure reaches the minimum, which is about 9.14%.

Figure 3B:
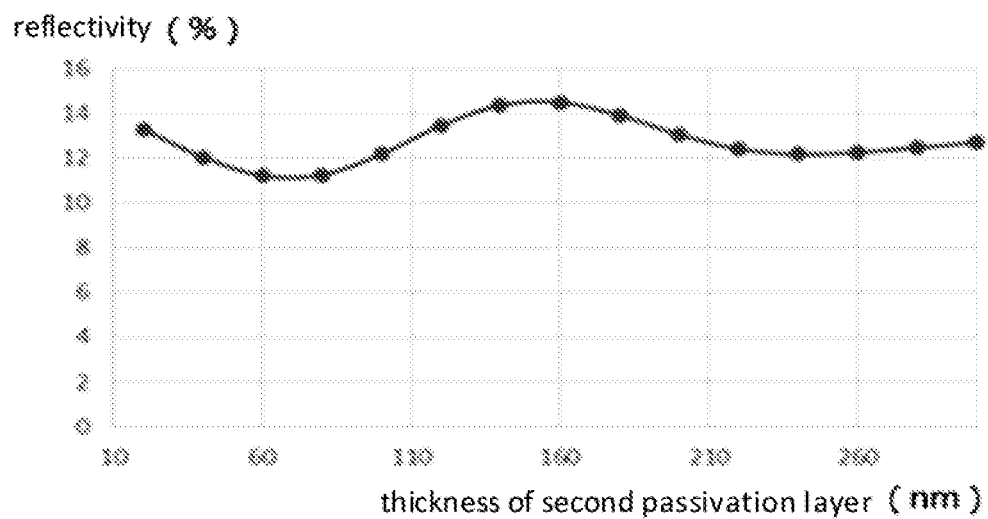
FIG. 3b is a graph showing a variation of an overall reflectivity of a second laminated structure with varying of a thickness of the second passivation layer when a material of a first passivation layer is silicon nitride and a material of the second passivation layer is silicon oxynitride.

FIG. 3b is a graph showing a variation of the overall reflectivity of the second laminated structure with varying of the thickness of the second passivation layer 5 when the first passivation layer is made of silicon nitride and the second passivation layer is made of silicon oxynitride, as shown in FIG. 3b, the thickness of the first passivation layer 3 is fixed at about 200 nm, when the thickness of the second passivation layer 5 is about 240 nm, the overall reflectivity of the second laminated structure reaches the minimum, which is about 12.2%.

When the first passivation layer 3 is made of silicon nitride, the second passivation layer 5 is made of silicon oxynitride, and the thickness of the first passivation layer 3 is about 200 nm and the thickness of the second passivation layer 5 is about 240 nm, the overall reflectivity of the first laminated structure and the overall reflectivity of the second laminated structure each can reach the minimum, but there is a certain difference between these minimum overall reflectivities (the difference is about 12.2%−9.14%=3.06%).

Although the configurations of materials and thicknesses of the first passivation layer 3 and the second passivation layer 5 as above can make the overall reflectivity of the first laminated structure and the overall reflectivity of the second laminated structure both at a relatively low level (both the overall reflectivities are less than 13%), the overall reflectivities of the first laminated structure and the second laminated structure still have a certain difference therebetween, and the visibility of the first metal conductive layer pattern 2 is different from the visibility of the second metal conductive layer pattern 4, which may also affect the user's visual experience to a certain extent.

Figure 4A:
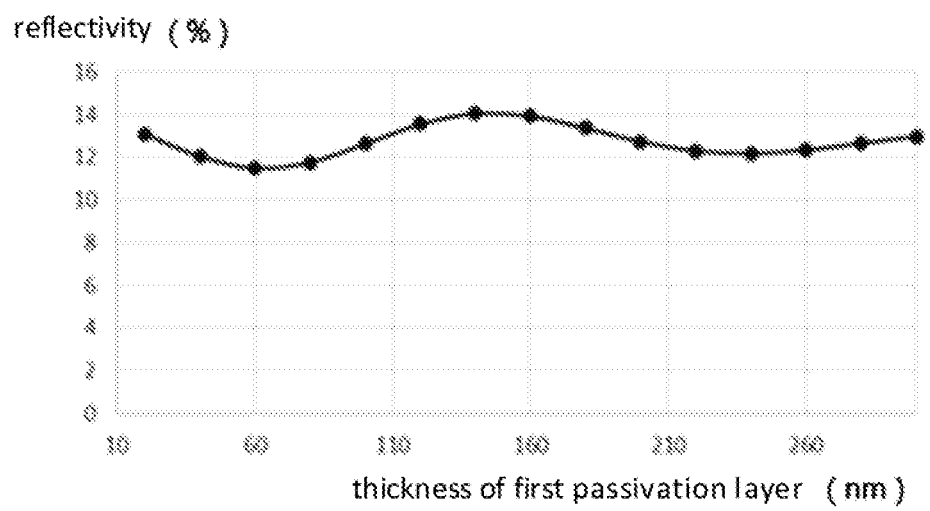
FIG. 4a is a graph showing a variation of an overall reflectivity of a first laminated structure with varying of a thickness of a first passivation layer when materials of the first passivation layer and a second passivation layer are both silicon oxynitride.

FIG. 4a is a graph showing a variation of the overall reflectivity of the first laminated structure with varying of the thickness of the first passivation layer 3 when the materials of the first passivation layer and the second passivation layer are both silicon oxynitride, as shown in FIG. 4a, the thickness of the second passivation layer 5 is fixed at about 240 nm, the when the thickness of the first passivation layer 3 is about 240 nm, the overall reflectivity of the first laminated structure reaches the minimum, which is about 12.2%.

Figure 4B:
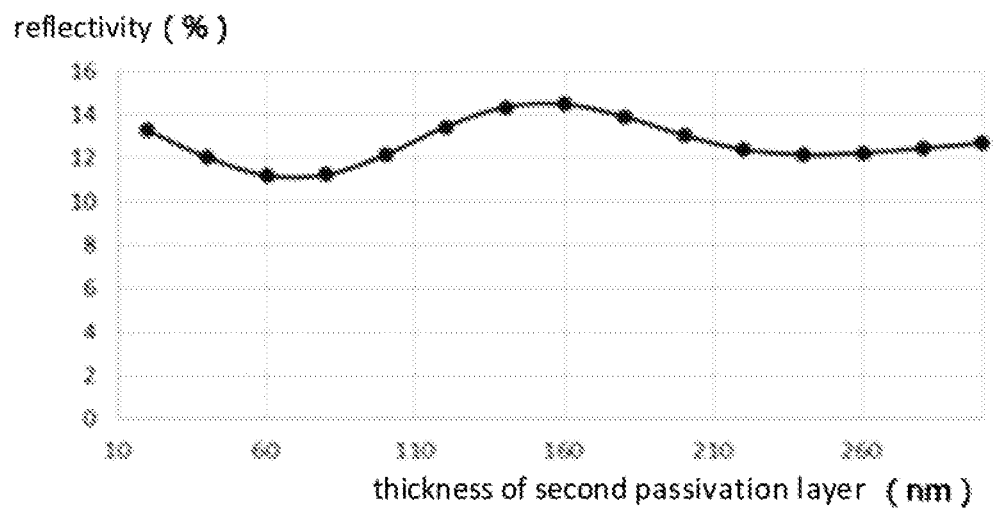
FIG. 4b is a graph showing a variation of an overall reflectivity of a second laminated structure with varying of a thickness of a second passivation layer when materials of a first passivation layer and the second passivation layer are both silicon oxynitride.

FIG. 4b is a graph showing a variation of the overall reflectivity of the second laminated structure with varying of the thickness of the second passivation layer 5 when the materials of the first passivation layer and the second passivation layer are both silicon oxynitride, as shown in FIG. 4b, the thickness of the first passivation layer 3 is fixed at about 240 nm, when the thickness of the second passivation layer 5 is about 240 nm, the overall reflectivity of the second laminated structure reaches the minimum, which is about 12.2%.

When the first passivation layer 3 and the second passivation layer 5 both are made of silicon oxynitride, and the thickness of the first passivation layer 3 is about 240 nm and the thickness of the second passivation layer 5 is about 240 nm, the overall reflectivity of the first laminated structure and the overall reflectivity of the second laminated structure can both reach the minimum, and both these minimum overall reflectivities are substantially the same (about 12.2%).

Based on the above simulation results, in the embodiment of the present disclosure, when the first passivation layer 3 and the second passivation layer 5 are both made of silicon oxynitride, and the thickness of the first passivation layer 3 ranges from about 230 nm to about 250 nm and the thickness of the second passivation layer 5 ranges from about 230 nm to about 250 nm, both the overall reflectivity of the first laminated structure and the overall reflectivity of the second laminated structure can be at a relatively low level (both overall reflectivities are less than 13%), and the overall reflectivities of the first laminated structure and the second laminated structure can be the same or substantially the same. In addition, compared with silicon nitride, the silicon oxynitride can better solve the problem of bubbling in a relatively high-temperature curing process of the planarization layer, and can effectively improve the yield of a production line.

Figure 5:
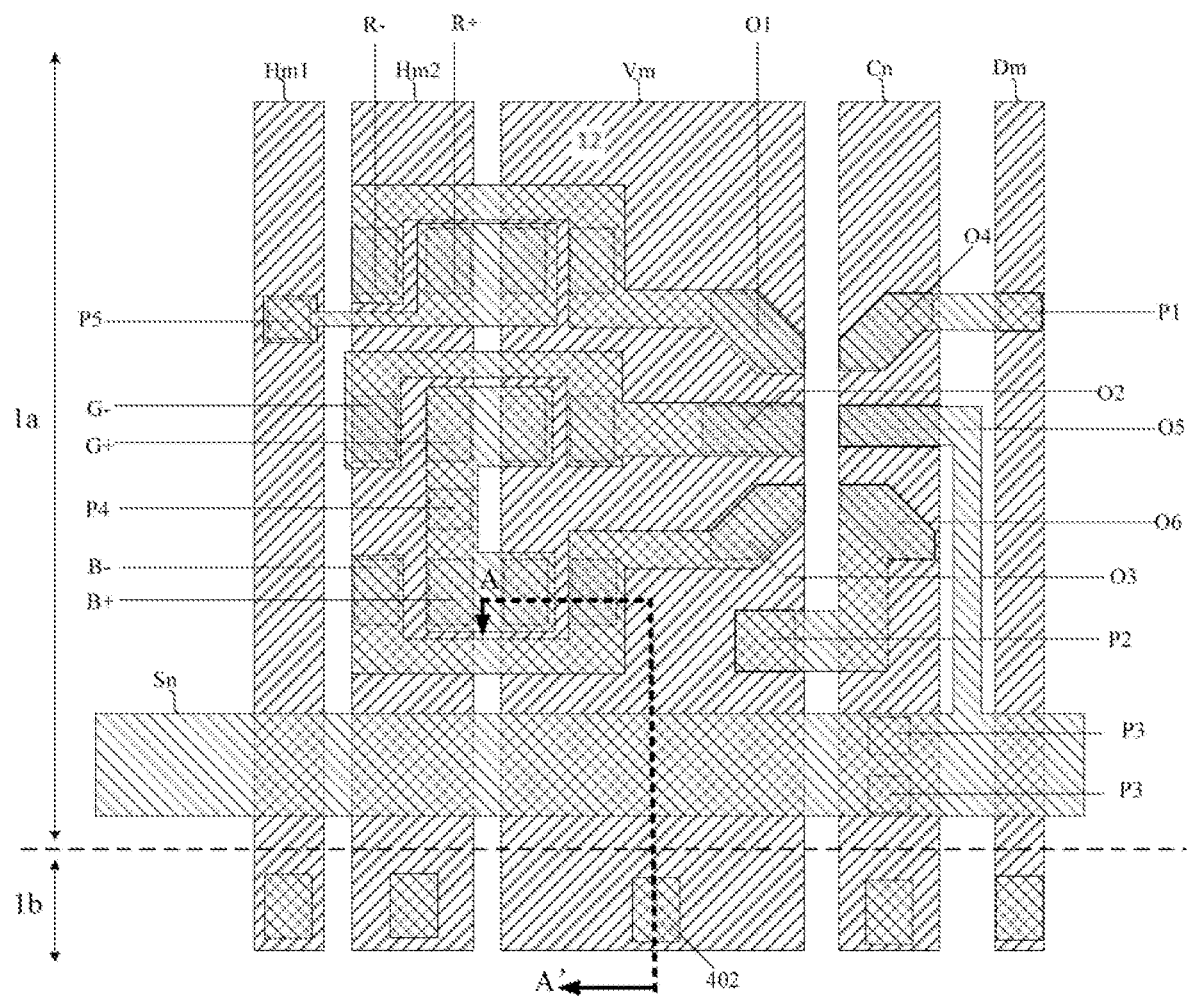
FIG. 5 is a schematic top view of a partial region of an LED display substrate according to an embodiment of the present disclosure.
Figure 6:
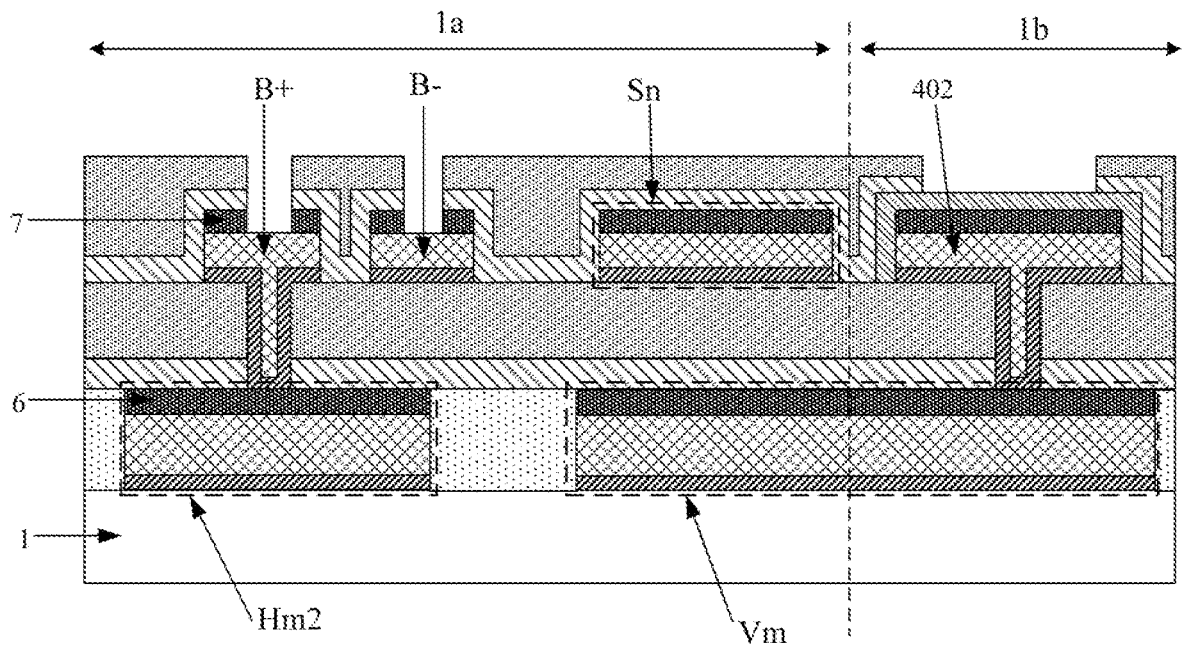
FIG. 6 is a schematic cross-sectional view taken along line A-A' of FIG. 5.

FIG. 5 is a schematic top view of a partial region of an LED display substrate according to an embodiment of the disclosure, FIG. 6 is a schematic cross-sectional view taken along line A-A' in FIG. 5, and as shown in FIG. 5 and FIG. 6, a scan signal supply line Cn, a scan line Sn, a data line Dm, a positive signal lines Hm1 and Hm2, and a reference signal line Vm are disposed in the display area 1a. The scan signal supply line Cn is electrically connected with the scan line Sn for supplying a scan signal to the scan line Sn, the data line is configured to provide a data signal, the reference signal line is configured to provide a negative signal, and the positive signal line is configured to provide a positive signal.

With continued reference to FIG. 5, the LED chip in the LED display substrate is driven by a pixel driving chip (not shown), and thus it is desired to provide a corresponding driving chip connection terminal in the LED display substrate for the pixel driving chip.

Taking the case shown in FIG. 5 as an example, each pixel includes three sub-pixels of different colors and a pixel driving chip, and each sub-pixel includes at least one LED chip (which is shown in the figure); the three sub-pixels of different colors are provided with six first connection terminals, which are respectively referred to as: a negative connection terminal R− for a sub-pixel of first color, a positive connection terminal R+ for the sub-pixel of first color, a negative connection terminal B− for a sub-pixel of second color, a positive connection terminal B+ for the sub-pixel of second color, a negative connection terminal G− for a sub-pixel of third color, and a positive connection terminal G+ for the sub-pixel of third color.

The pixel driving chip has six pins, and accordingly, it is desired to provide six chip connection terminals for the pixel driving chip in the LED display substrate, the six chip connection terminals are respectively referred to as: a first chip connection terminal O1, a second chip connection terminal O2, a third chip connection terminal O3, a fourth chip connection terminal O4, a fifth chip connection terminal O5, and a sixth chip connection terminal O6.

The first chip connection terminal O1 is connected with the negative connection terminal R− for the sub-pixel of first color, the second chip connection terminal O2 is connected with the negative connection terminal G− for the sub-pixel of third color, the third chip connection terminal O3 is connected with the negative connection terminal B− for the sub-pixel of second color, the fourth chip connection terminal O4 is connected with the scan line Sn, the fifth chip connection terminal O5 is connected with the data line Dm through a via hole P1, and the sixth chip connection terminal O6 is connected with the reference signal line Vm through a via hole P2. The positive connection terminal R+ for the sub-pixel of first color is connected with the positive signal line Hm1 through a via hole P5, the positive connection terminal G+ for the sub-pixel of third color is connected with the positive signal line Hm2 through a via hole P4, and the positive connection terminal B+ for the sub-pixel of second color is connected with the positive signal line Hm2 through the via hole P4.

The pixel driving chip is configured to write data signals provided by the data line Dm into the sub-pixels of different colors in a time-sharing (time-division) manner under the control of scan lines Sn, where the reference signal line Vm is configured to provide a negative signal to the pixel driving chip 2, so that a current path is formed between the pixel driving chip 2 and the inorganic light emitting diode.

In some implementations, the scan signal supply line Cn, the data signal line Dm, the reference signal line Vm, the positive signal lines Hm1 and Hm2 (i.e., as signal wires) are all disposed in the first metal conductive layer, and the first connection terminals R−/R+/G−/G+/B−/B+, the second connection terminals 402, the chip connection terminals O1/O2/O3/O4/O5/O6, and the scan line Sn are all disposed in the second metal conductive layer.

An embodiment of the present disclosure further provides a display panel, including the LED display substrate provided by the above embodiment.

It should be noted that, in some implementations, the signal lines of the LED display panel driven by the pixel driving circuit may also adopt the design of the above-mentioned providing the blackening layer patterns, and a lamp panel including the Micro/Mini-LEDs may also adopt the design of the above-mentioned providing the blackening layer patterns, which are not described in detail herein.

In some implementations, the base substrate is a flexible substrate, a bendable region is arranged between the display area and the bonding area, and the bonding area (with the FPC fixed thereto) can be bent to the back of the LED display substrate. When a plurality of LED display substrates are spliced to form the display panel, since the bonding area is positioned on the back of the LED display substrate, a gap between adjacent LED display substrates can be reduced, and the overall display effect of the display panel can be improved.

An embodiment of the present disclosure further provides a method for manufacturing an LED display substrate, which can be used for manufacturing the LED display substrate provided by the above embodiment.

Figure 7:
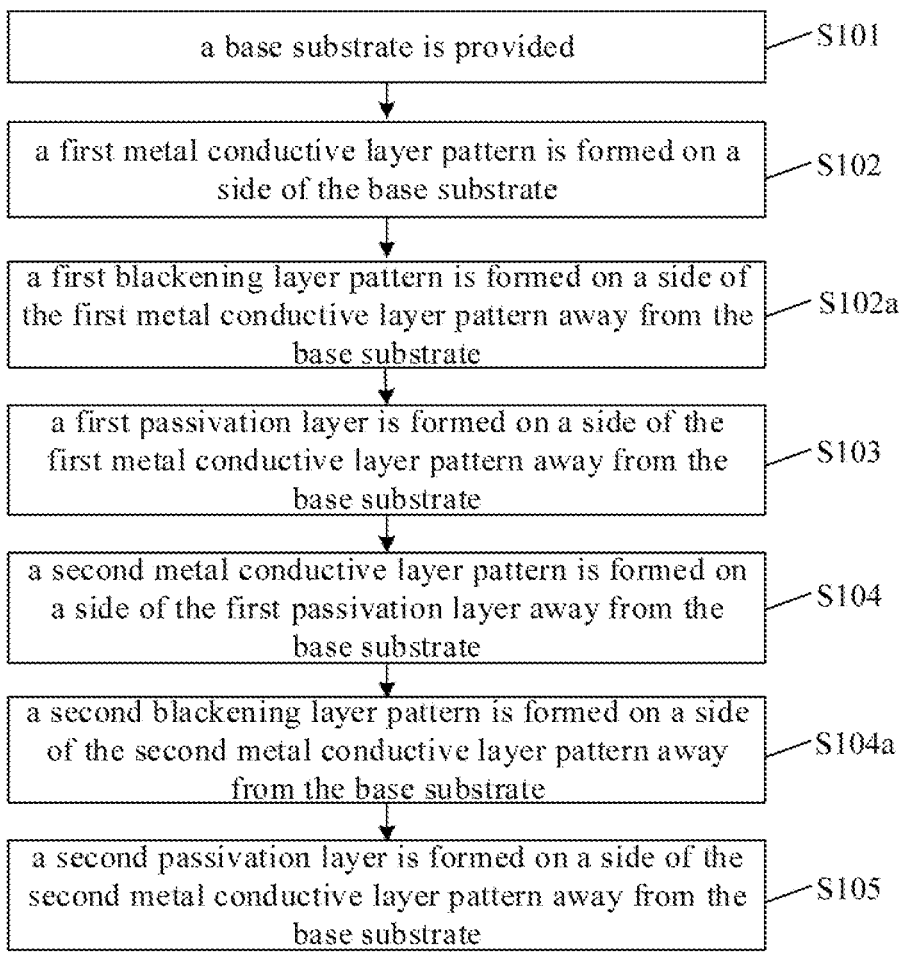
FIG. 7 is a flowchart of a method for manufacturing an LED display substrate according to an embodiment of the present disclosure.

FIG. 7 is a flowchart of a method for manufacturing an LED display substrate according to an embodiment of the present disclosure, and as shown in FIG. 7, the method includes steps S101 to S105.

At the step S101, a base substrate is provided, where the base substrate includes a display area and a bonding area.

At the step S102, a first metal conductive layer pattern is formed on a side of the base substrate.

The first metal conductive layer pattern includes a plurality of signal wires.

At the step S102a, a first blackening layer pattern is formed on a side of the first metal conductive layer pattern away from the base substrate.

An orthographic projection of the first blackening layer pattern on the base substrate is located in an area where an orthographic projection of the first metal conductive layer pattern on the base substrate is located.

At the step S103, a first passivation layer is formed on a side of the first metal conductive layer pattern away from the base substrate.

At the step S104, a second metal conductive layer pattern is formed on a side of the first passivation layer away from the base substrate.

The second metal conductive layer pattern includes first connection terminals in the display area and second connection terminals in the bonding area, the first connection terminals and the second connection terminals are respectively connected with corresponding signal wire patterns through via holes.

At the step S104a, a second blackening layer pattern is formed on a side of the second metal conductive layer pattern away from the base substrate.

An orthographic projection of the second blackening layer pattern on the base substrate is located in an area where an orthographic projection of the second metal conductive layer pattern on the base substrate is located.

At the step S105, a second passivation layer is formed on a side of the second metal conductive layer pattern away from the base substrate.

In some implementations, if the first blackening layer pattern is not provided, the method does not include the step S102a; if the second blackening layer pattern is not provided, the method does not include the step S104a.

Figure 8:
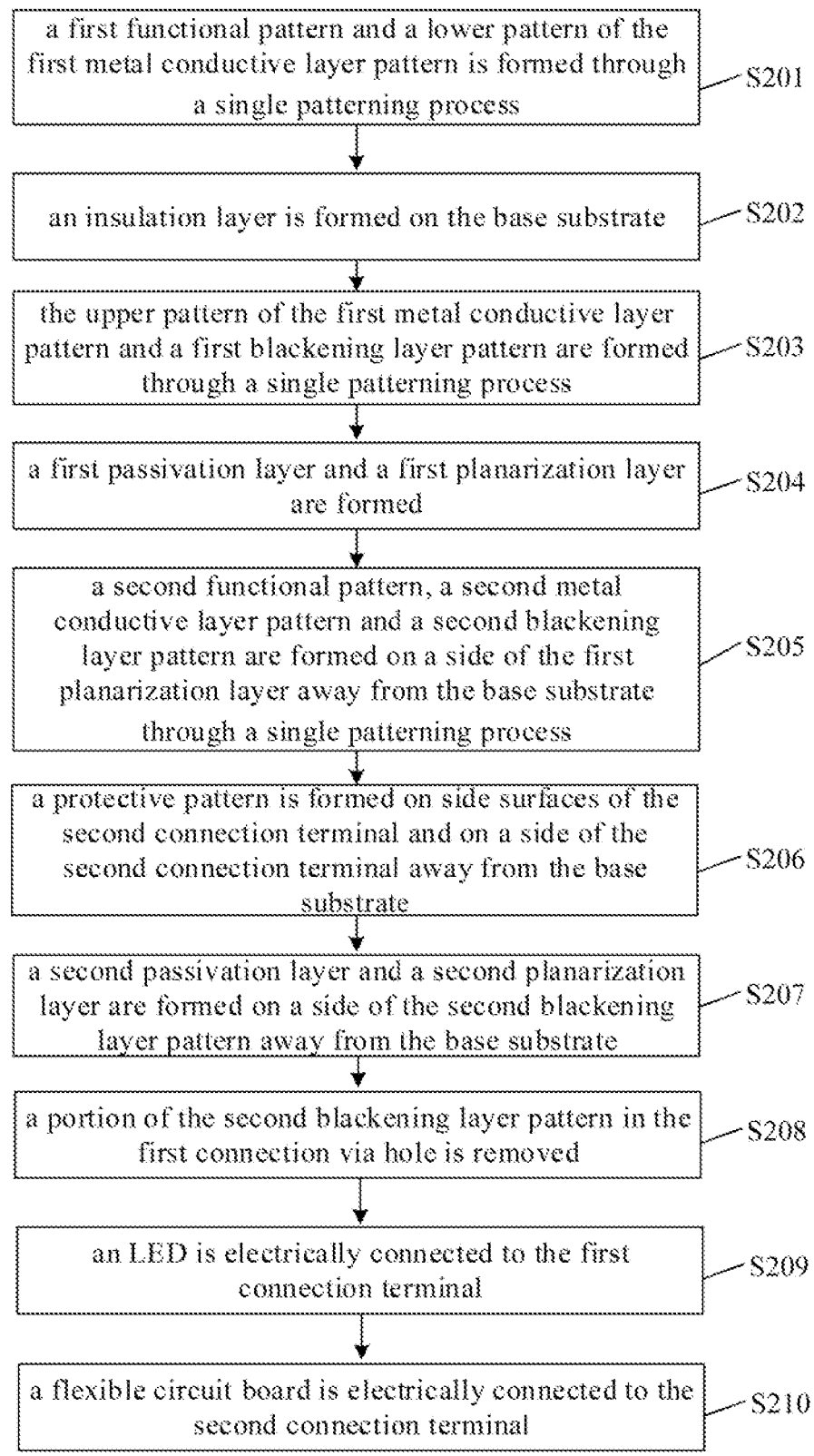
FIG. 8 is a flowchart of a method for manufacturing an LED display substrate according to an embodiment of the present disclosure.
Figure 9A:
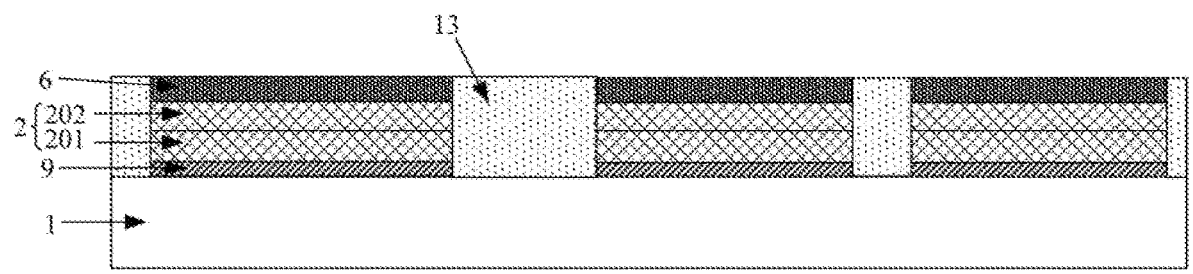
FIGS. 9a to 9e are schematic structural diagrams of intermediate products during manufacturing the LED display substrate shown in FIG. 1 by using the method shown in FIG. 8.
Figure 9B:
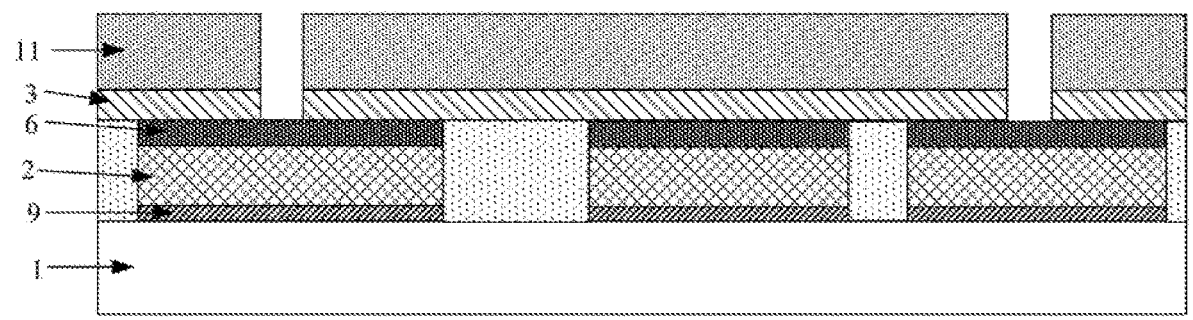
Figure 9C:
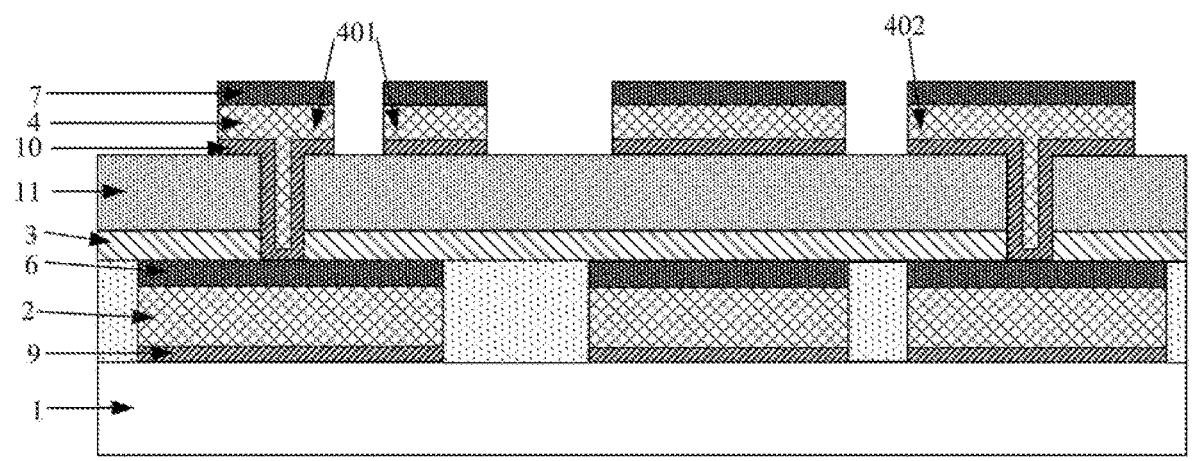
Figure 9D:
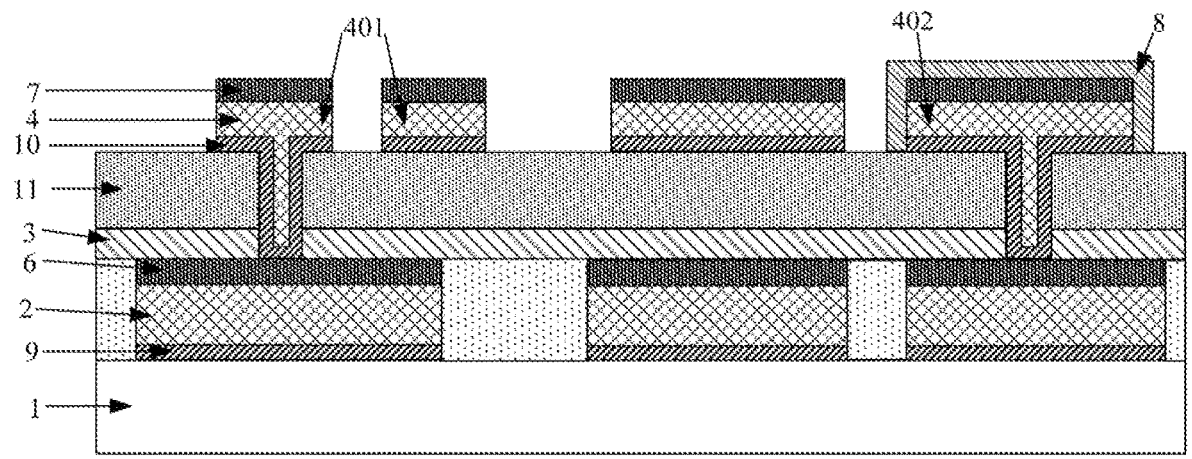
Figure 9E:
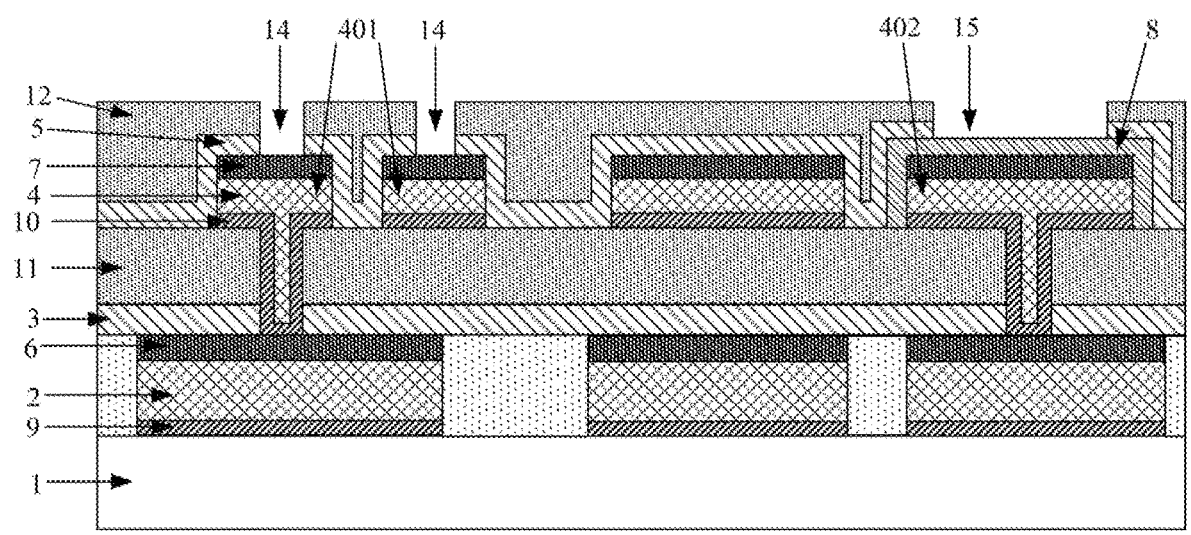

FIG. 8 is a flowchart of a method for manufacturing an LED display substrate according to an embodiment of the present disclosure, and FIGS. 9a to 9e are schematic structural diagrams of intermediate products of the LED display substrate shown in FIG. 1 manufactured by using the method shown in FIG. 8, as shown in FIGS. 8 to 9e, the method includes steps S201 to S210.

At the step S201, a first functional pattern and a lower pattern of the first metal conductive layer pattern are formed through a single patterning process.

Since most of the structures in the first metal conductive layer pattern are signal wires, a length of each signal wire is relatively long, and in such case, in order to ensure that the overall impedance of the signal wire is relatively small, the thickness of the first metal conductive layer pattern is generally designed to be relatively large. Taking the material of the first metal conductive layer pattern being copper as an example, the thickness of the first metal conductive layer pattern is generally desired to reach about 1.8 µm. When a copper thin film is formed by using an existing sputter process, a limited thickness of the formed copper thin film is about 1 µm, and when the thickness of the formed copper thin film is larger than cracks may occur in the copper thin film due to excessive internal stress. Therefore, in order to form the first metal conductive layer pattern, two sputter processes (where the film stress can be effectively reduced by performing a patterning process after the first sputter process) are desired to form a lower pattern and an upper pattern of the first metal conductive layer pattern respectively.

It should be noted that, the patterning process in the embodiment of the present disclosure includes process steps of photoresist coating, mask exposure, development, film etching, photoresist stripping, and the like. When the material film to be patterned is made of a photoresist material, a corresponding pattern may be obtained through processes including the mask exposure and the development.

In some implementations, the first functional pattern and the lower pattern of the first metal conductive layer pattern may be obtained through a single patterning process. Specifically, a second protective material film and a first metal material film (which is formed through a sputter process and has a thickness of about 0.9 µm) are sequently formed firstly; and then, a patterning process is performed on the first metal material film and the second protective material film by using a first mask plate to obtain the first functional pattern and the lower pattern of the first metal conductive layer pattern, where the first functional pattern and the lower pattern of the first metal conductive layer pattern are identical in shape.

In some implementations, a material of the first functional pattern includes molybdenum or a molybdenum niobium alloy.

At the step S202, an insulation layer is formed on the base substrate.

Firstly, an insulation material film is formed, and then, a patterning process is performed on the insulation material film by using the first mask plate so as to remove a part, covering the lower pattern of the first metal conductive layer pattern, of the insulation material film, and form a hollow-out structure, so that the lower pattern of the first metal conductive layer pattern is exposed.

A material of the insulation material film includes at least one of polyamide, polyurethane, phenolic resin or polysiloxane, the insulation material film may be formed by a coating process. A thickness of the insulation material film is larger than a sum of thicknesses of the second protective material film and the first metal material film; the insulation layer may be used for aligning the upper pattern of the first metal conductive layer pattern formed later with the lower pattern of the first metal conductive layer pattern, and may also be used for preventing the lower pattern of the first metal conductive layer pattern and the first functional pattern from being etched mistakenly in a subsequent process of forming the upper pattern of the first metal conductive layer pattern through a patterning process.

At the step S203, the upper pattern of the first metal conductive layer pattern and a first blackening layer pattern are formed through a single patterning process.

Firstly, a second metal material film and a first blackening material film are sequentially formed on a side of the lower pattern of the first metal conductive layer pattern away from the base substrate, where the second metal material film is the same as the first metal material film in material; and then, a patterning process is performed on the second metal material film and the first blackening material film by using the first mask plate so as to obtain the upper pattern of the first metal conductive layer pattern and the first blackening layer pattern. In some implementations, a material of the first blackening material film includes at least one of molybdenum oxide, molybdenum nitride, molybdenum oxynitride, molybdenum niobium oxide, molybdenum niobium nitride or molybdenum niobium oxynitride.

Referring to FIG. 9a, the upper pattern 202 of the first metal conductive layer pattern 2 and the first blackening layer pattern 6 are located in the hollow-out structure surrounded by the insulation layer 13 and are exactly aligned with the lower pattern 201 of the first metal conductive layer pattern 2, and in such case, the first functional pattern 9, the lower pattern 201 of the first metal conductive layer pattern 2, the upper pattern 202 of the first metal conductive layer pattern 2, and the first blackening layer pattern 6 are exactly aligned with each other.

In some implementations, a surface of the insulation layer 13 away from the base substrate 1 and a surface of the first blackening layer pattern 6 away from the base substrate 1 are in a same plane, i.e., flush with each other, to form a flat surface.

At the step S204, a first passivation layer and a first planarization layer are formed.

Referring to FIG. 9b, firstly, a first passivation material film and a first planarization material film are sequentially formed; then, a patterning process is performed on the first planarization material film to obtain a pattern of the first planarization layer 11; next, the first passivation material film is patterned by using the pattern of the first planarization layer 11 as a mask pattern to obtain a pattern of the first passivation layer 3, and a via hole communicating with the first blackening layer pattern 6 is formed in the first passivation layer 3.

In some implementations, a material of the first passivation material film includes silicon oxynitride, and a thickness of the first passivation material film ranges from about 230 nm to about 250 nm.

At the step S205, a second functional pattern, a second metal conductive layer pattern and a second blackening layer pattern are formed on a side of the first planarization layer away from the base substrate through a single patterning process.

Since most of the structures in the second metal conductive layer pattern are connection terminals, a size of each connection terminal is relatively small, and an overall impedance of each connection terminal is also relatively small in the case of each connection terminal having a relatively small thickness, the thickness of the first metal conductive layer pattern is generally designed to be relatively small (generally smaller than about 1 μm), and a metal material film for forming the second metal conductive layer pattern is formed by only one sputter process. Therefore, the second functional pattern, the second metal conductive layer pattern and the second blackening layer pattern may be manufactured through a single patterning process.

Referring to FIG. 9c, firstly, a third protective material film, a third metal material film, and a second blackening material film are sequentially formed; then, a patterning process is performed on the third protective material film, the third metal material film, and the second blackening material film by using a second mask plate to obtain the second functional pattern 10, the second metal conductive layer pattern 4, and the second blackening layer pattern 7. In some implementations, a material of the second blackening material film includes at least one of molybdenum oxide, molybdenum nitride, molybdenum oxynitride, molybdenum niobium oxide, molybdenum niobium nitride or molybdenum niobium oxynitride.

The second metal conductive layer pattern 4 at least includes first connection terminals 401 located in the display area and second connection terminals 402 located in the bonding area, and a portion of the first connection terminals 401 and the second connection terminals 402 are electrically connected to the corresponding signal wire patterns respectively through via holes.

At the step S206, a protective pattern is formed on side surfaces of the second connection terminal and on a side of the second connection terminal away from the base substrate.

Referring to FIG. 9d, firstly, a first protective material film is formed; then, the first protective material film is patterned to obtain the protective pattern 8; the protective pattern 8 covers the second blackening layer pattern 7 on the second connection terminal 402 and the side surfaces of the second connection terminal 402.

At the step S207, a second passivation layer and a second planarization layer are formed on a side of the second blackening layer pattern away from the base substrate.

Referring to FIG. 9e, firstly, a second passivation material film and a second planarization material film are sequentially formed; next, a patterning process is performed on the second planarization material film to obtain a pattern of the second planarization layer 12; then, the second passivation material film is patterned by using the pattern of the second planarization layer 12 as a mask pattern to obtain a pattern of the second passivation layer 5, and the second passivation layer 5 is formed with first connection via holes 14 communicated to first actual connection regions of the first connection terminals 401 and second connection via holes 15 communicated to second actual connection regions of the second connection terminals 402.

In some implementations, a material of the second passivation material film includes silicon oxynitride, and a thickness of the first passivation material film ranges from about 230 nm to about 250 nm.

At the step S208, a portion of the second blackening layer pattern in the first connection via holes is removed.

Referring to FIG. 1, the second planarization layer 12 and the second passivation layer 5 are used as mask patterns to etch the second blackening layer pattern 7 to remove the portion of the second blackening layer pattern 7 located in the first connection via holes 14. In the process of etching the second blackening layer pattern, the etching depth is desired to be accurately controlled so as to avoid the first connection terminals below from being etched mistakenly. During etching the portion of the second blackening layer pattern 7 located in the first connection via holes 14, a portion of the second blackening layer pattern 7 located in the second connection via holes 15 is protected by the protective pattern 8 and is not etched.

Through the steps S201 to S208, the LED display substrate shown in FIG. 1 can be manufactured.

In some implementations, after the step S208, the method further includes steps S209 and S210.

At the step S209, an LED is electrically connected to the first connection terminal.

In the step S209, firstly, solder is applied to the first connection terminals, and then the LED chip is transferred to a corresponding position, and then reflow soldering is performed to complete the bonding of the LED.

At the step S210, the flexible circuit board is electrically connected to the second connection terminal.

In the step S210, an anisotropic conductive film (ACF) is firstly attached to the second connection terminal; and then connection pins of the FPC is fixed to the second connection terminal through a hot pressing process to complete the bonding of the FPC.

In the LED display substrate manufactured by the method according to the embodiment of the present disclosure, the first blackening layer pattern and the second blackening layer pattern are provided, so that the visibility of the first metal conductive layer pattern and the second metal conductive layer pattern can be decreased to a certain extent, facilitating to improve the display quality of the LED display substrate.

It will be understood that the above embodiments are merely exemplary embodiments adopted to illustrate the principles of the present disclosure, and the present disclosure is not limited thereto. It will be apparent to those skilled in the art that various modifications and improvements can be made without departing from the spirit and scope of the present disclosure, and such modifications and improvements are also considered to be within the scope of the present disclosure.

The invention claimed is:

1. An LED display substrate, comprising:
a base substrate comprising a display area and a bonding area;
a first metal conductive layer pattern located on the base substrate and comprising a plurality of signal wires;
a first passivation layer located on a side of the first metal conductive layer pattern away from the base substrate;
a second metal conductive layer pattern located on a side of the first passivation layer away from the base substrate and comprising a first connection terminal and a second connection terminal which are respectively connected with a corresponding signal wire pattern through a via hole;
a second passivation layer located on a side of the second metal conductive layer pattern away from the base substrate; wherein
a first blackening layer pattern is provided between the first metal conductive layer pattern and the first passivation layer, and an orthographic projection of the first blackening layer pattern on the base substrate is located in an area where an orthographic projection of the first metal conductive layer pattern on the base substrate is located;
and/or a second blackening layer pattern is provided between the second metal conductive layer pattern and the second passivation layer, and an orthographic projection of the second blackening layer pattern on the base substrate is located in an area where an orthographic projection of the second metal conductive layer pattern on the base substrate is located, and wherein
the first connection terminal comprises a first actual connection region, and the orthographic projection of the second blackening layer pattern on the base substrate and an orthographic projection of a portion of the second metal conductive layer pattern except the first actual connection region on the base substrate completely coincide; and
a protective pattern is provided on a side of the second connection terminal away from the base substrate and at side surfaces of the second connection terminal, a material of the protective pattern is a metal oxide conductive material, and a portion of the second blackening layer pattern covering the second connection terminal is located between the protective pattern and the second connection terminal.

2. The LED display substrate of claim 1, wherein the orthographic projection of the first blackening layer pattern on the base substrate and the orthographic projection of the first metal conductive layer pattern on the base substrate completely coincide.

3. The LED display substrate of claim 1, wherein a material of the first blackening layer pattern comprises at least one of metal oxide, metal nitride or metal oxynitride; and
a material of the second blackening layer pattern comprises at least one of metal oxide, metal nitride or metal oxynitride.

4. The LED display substrate of claim 3, wherein the material of the first blackening layer pattern comprises at least one of molybdenum oxide, molybdenum nitride, molybdenum oxynitride, molybdenum niobium oxide, molybdenum niobium nitride or molybdenum niobium oxynitride; and
the material of the second blackening layer pattern comprises at least one of molybdenum oxide, molybdenum nitride, molybdenum oxynitride, molybdenum niobium oxide, molybdenum niobium nitride or molybdenum niobium oxynitride.

5. The LED display substrate of claim 1, wherein a material of the first passivation layer comprises at least one of silicon oxide, silicon nitride or silicon oxynitride; and
a material of the second passivation layer comprises at least one of silicon oxide, silicon nitride, or silicon oxynitride.

6. The LED display substrate of claim 5, wherein the material of the first passivation layer comprises silicon oxynitride, and a thickness of the first passivation layer ranges from about 230 nm to about 250 nm; and the material of the second passivation layer comprises silicon oxynitride, and a thickness of the second passivation layer ranges from about 230 nm to about 250 nm.

7. The LED display substrate of claim 1, wherein a first functional pattern in contact with the first metal conductive layer pattern is provided on a side of the first metal conductive layer pattern close to the base substrate, and the first functional pattern is configured to improve bonding firmness between the first metal conductive layer pattern and the base substrate;

and/or a second functional pattern in contact with the second metal conductive layer pattern is provided on a side of the second metal conductive layer pattern close to the base substrate, and the second functional pattern is configured to improve bonding firmness between the second metal conductive layer pattern and a film layer located on the side of the second metal conductive layer pattern close to the base substrate.

8. The LED display substrate of claim 7, wherein a material of the first functional pattern comprises molybdenum or a molybdenum niobium alloy; and a material of the second functional pattern comprises molybdenum or a molybdenum niobium alloy.

9. The LED display substrate of claim 1, wherein a first planarization layer is disposed between the first passivation layer and the second metal conductive layer pattern;

and/or a second planarization layer is disposed on a side of the second passivation layer away from the base substrate.

10. A display panel, comprising: the LED display substrate of claim 1.

11. A method for manufacturing the LED display substrate of claim 1, comprising:

providing a base substrate, wherein the base substrate comprises a display area and a bonding area;

forming a first metal conductive layer pattern on a side of the base substrate, wherein the first metal conductive layer pattern comprises a plurality of signal wires;

forming a first passivation layer on a side of the first metal conductive layer pattern away from the base substrate;

forming a second metal conductive layer pattern on a side of the first passivation layer away from the base substrate, wherein the second metal conductive layer pattern comprises a first connection terminal located in the display area and a second connection terminal located in the bonding area, the first connection terminal and the second connection terminal are respectively connected with a corresponding signal wire pattern through a via hole;

forming a second passivation layer on a side of the second metal conductive layer pattern away from the base substrate;

wherein, the method further comprises: before forming the first passivation layer, forming a first blackening layer pattern on the side of the first metal conductive layer pattern away from the base substrate, an orthographic projection of the first blackening layer pattern on the base substrate is located in an area where an orthographic projection of the first metal conductive layer pattern on the base substrate is located;

and/or, the method further comprises: before forming the second passivation layer, forming a second blackening layer pattern on the side of the second metal conductive layer pattern away from the base substrate, an orthographic projection of the second blackening layer pattern on the base substrate is located in an area where an orthographic projection of the second metal conductive layer pattern on the base substrate is located, and wherein the first connection terminal comprises a first actual connection region, and the orthographic projection of the second blackening layer pattern on the base substrate and an orthographic projection of a portion of the second metal conductive layer pattern except the first actual connection region on the base substrate completely coincide; and the method further comprises: forming a protective pattern on a side of the second connection terminal away from the base substrate and at side surfaces of the second connection terminal, a material of the protective pattern is a metal oxide conductive material, and a portion of the second blackening layer pattern covering the second connection terminal is located between the protective pattern and the second connection terminal.

12. The method of claim 11, wherein the forming a second metal conductive layer pattern and the forming a second blackening layer pattern comprise:

forming a third metal material film on the side of the first passivation layer away from the base substrate;

forming a second blackening material film on a side of the third metal material film away from the base substrate;

performing a patterning process on the third metal material film and the second blackening material film by using a second mask plate to obtain the second metal conductive layer pattern and the second blackening layer pattern;

a first connection via hole is formed in the first passivation layer at a position directly opposite to the first actual connection region;

the method further comprises: after forming the first passivation layer, removing a portion of the second blackening layer pattern in the first connection via hole.

13. The method of claim 12, further comprising:

after removing the portion of the second blackening layer pattern in the first connection via hole, electrically connecting an LED with the first connection terminal; and electrically connecting a flexible circuit board with the second connection terminal.

14. The LED display substrate of claim 2, wherein a first planarization layer is disposed between the first passivation layer and the second metal conductive layer pattern;

and/or a second planarization layer is disposed on a side of the second passivation layer away from the base substrate.

15. The LED display substrate of claim 5, wherein a first planarization layer is disposed between the first passivation layer and the second metal conductive layer pattern;

and/or a second planarization layer is disposed on a side of the second passivation layer away from the base substrate.

16. A display panel, comprising: the LED display substrate of claim 2.

17. A display panel, comprising: the LED display substrate of claim 3.

18. A display panel, comprising: the LED display substrate of claim 4.

* * * * *